United States Patent [19]
Goetz

[11] 4,099,119
[45] Jul. 4, 1978

[54] PROBE APPARATUS FOR IN PLACE TESTING OF ELECTRICAL CIRCUIT BOARDS

[75] Inventor: Heinz E. Goetz, Ontario, Calif.

[73] Assignee: Honeywell Inc., Minneapolis, Minn.

[21] Appl. No.: 765,149

[22] Filed: Feb. 3, 1977

[51] Int. Cl.² .................................. G01R 31/02
[52] U.S. Cl. .................. 324/73 PC; 324/158 P; 324/72.5
[58] Field of Search .......... 324/73 PC, 73 R, 158 F, 324/158 P, 72.5

[56] References Cited

U.S. PATENT DOCUMENTS

| | | | |
|---|---|---|---|
| 3,806,800 | 4/1974 | Bove et al. | 324/158 P X |
| 3,975,680 | 8/1976 | Webb | 324/73 PC X |
| 4,012,693 | 3/1977 | Sullivan | 324/73 PC |
| 4,045,737 | 8/1977 | Coberly | 324/158 P |

Primary Examiner—Rudolph V. Rolinec
Assistant Examiner—Vincent J. Sunderdick
Attorney, Agent, or Firm—Charles L. Rubow; Henry L. Hanson

[57] ABSTRACT

Probe apparatus is disclosed for in place testing of circuit boards of the type which carry electrical components interconnected at nodes accessible from at least a first side of the board. The probe apparatus may comprise a card which is attached to the circuit board under test adjacent its first side. A probe module, including signal conditioning means and a short interfacing element, is mounted on the card in close proximity to the node of interest. The signal conditioning means and interfacing element may comprise electrical decoupling and signal pick off means capable of sensing signals at the node while minimizing introduction of spurious signals thereto.

12 Claims, 3 Drawing Figures

PROBE APPARATUS FOR IN PLACE TESTING OF ELECTRICAL CIRCUIT BOARDS

BACKGROUND OF THE INVENTION

The present invention relates generally to means for testing electrical circuit boards, and more specifically to probe apparatus for facilitating operational analysis of electrical circuit boards in place and under actual operating conditions.

Various techniques and forms of apparatus have been devised for checking out and analyzing the electrical performance of circuit boards now commonly employed in the construction of electrical and electronic equipment. The continuing trend in such testing is toward processing samples of signals under investigation directly at the point of signal interception. This trend is demonstrated by a variety of recently introduced test apparatus, of which an example is the Hewlett-Packard Model 548A Logic Clip.

It is obviously necessary that any circuit board testing technique or apparatus be compatible with the overall design and construction of the equipment of which the circuit board is a part. Electronic equipment of any complexity commonly includes a number of circuit boards which are integrated with remaining portions of the equipment by means of edge connectors. Groups of circuit boards may be compactly housed in a drawer, side by side in parallel planes. Stationary portions of a plurality of edge connectors are typically located at the back of the drawer on or adjacent a back plane or ground plane. The circuit boards are plugged into the stationary portions of the edge connectors and may be withdrawn from the front of the drawer.

In general, circuit board testing and check out techniques compatible with the above-described construction can be grouped into the following categories:

(1) Use of special test apparatus for testing circuit boards apart from the electronic equipment of which they are components.

(2) Use of a card extender or patch cable between a circuit board and mating portions of the host equipment to bring nodes and components on the board into a position where they can be reached with an external test probe, etc.

(3) Use of built in test points and/or indicators located at a conveniently accessible edge of the circuit board or other convenient location.

Each of the noted techniques has strong points and inherent disadvantages. For example, apparatus for testing circuit boards apart from the host equipment generally has the capability of accessing most or all nodes and/or electrical components on a board. However, the apparatus required for this method of testing is generally complicated, expensive and special purpose in nature. Typical examples are shown in U.S. Pat. Nos. 3,564,408 and 3,970,934 issued respectively to F. G. Schulz et al on Feb. 16, 1971 and A. Aksu on July 20, 1976, and in published articles such as Schwedner et al, "In-Circuit Testing Pins Down Defects in PC Boards Early", Electronics, pages 98—102 (Sept. 4, 1975). Additional inherent disadvantages are that the circuit board under investigation is removed from its normal location and environment, and is electrically powered from the testing apparatus which may supply power which differs in regulation, noise, etc. from that supplied by the normal working power supply. Further, the circuit board is supplied with test signals which are not necessarily identical to signals encountered in normal operation. The result is that the particular combination of environmental and signal characteristics which result in a malfunction of the circuit board may not be duplicated during the test procedure.

The card extender technique requires only relatively simple and inexpensive special purpose devices in combination with general purpose test instrumentation or a probe such as previously identified Logic Clip 548A. This technique has the additional advantage that the circuit card is powered and supplied with the same signals involved in normal operation. The circuit board is, however, removed from its normal working location and environment, and may be subjected to abnormal conditions of temperature and electrical and magnetic fields, etc. In addition, probes and/or conductors for sampling signals at the circuit nodes and carrying test signals may introduce spurious signals and/or provide distributed capacitance which disturbs normal circuit board performance.

The use of built-in test points and/or indicators has the advantage that electrical performance of a circuit board can be analyzed with the board in its normal working location and environment. In addition, special external test apparatus is normally not required. However, this technique requires additional components, conductors, indicators, etc. on each circuit board, thereby effectively limiting the number of test points. In addition, the test points are permanently assigned. Such test points may not be those of principal interest when searching for the cause of a particular malfunction. Accordingly, this technique lacks flexibility.

The applicant has devised a unique method and apparatus which permits circuit board operation to be analyzed with the board in its normal location and environment, and permits access to any node on the board. Operational analysis of a circuit board with the board operating in its normal place and under normal conditions is known as in situ testing. The test apparatus which is relatively simple and inexpensive, provides electrical decoupling in close proximity to any node supplying signals for analysis to prevent the introduction of signal disturbances. Accordingly, many of the disadvantages of prior art circuit board testing techniques and apparatus are reduced or eliminated.

SUMMARY OF THE INVENTION

The applicant's unique circuit board testing means basically comprises a support device adapted for mounting adjacent a circuit board on the side thereof from which component interconnection nodes are accessible, and a probe module mounted on the support device in close proximity to an interconnection node of interest. The probe module contains signal conditioning means and a short signal interfacing element, which may comprise electrical decoupling means and a signal pick off element for sampling electrical signals at the node while minimizing the likelihood of disturbing the signals. The support device also carries readout means connected to the signal conditioning means for providing an indication of signals at the node of interest.

The primary object of this invention is to provide an improved method and apparatus for investigating the electrical performance of electrical circuit boards.

It is a further object of this invention to provide circuit board testing apparatus in which signal conditioning is achieved a minimum distance from the test point.

A further object is to provide versatile apparatus for facilitating dynamic testing of electrical circuit boards in their actual operating environments.

Yet a further object is to provide testing apparatus in which electrical decoupling is accomplished a minimum distance from the test point.

Yet a further object is to provide for versatile in situ testing of electrical circuit boards with relatively simple, low cost apparatus.

Additional objects of the invention may be ascertained from a study of the disclosure, drawings and appended claims.

DESCRIPTION OF THE PREFERRED EMBODIMENT

Figure 1:
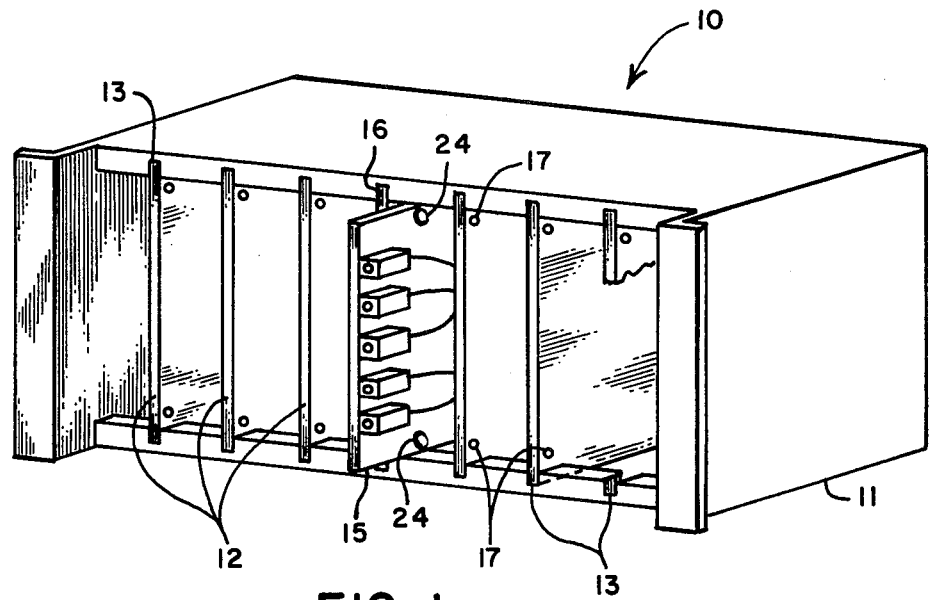
FIG. 1 illustrates an electrical circuit board drawer of basically conventional design with an illustrative embodiment of the applicant's probe apparatus installed for evaluating the electrical performance of a circuit board under test.
Figure 2:
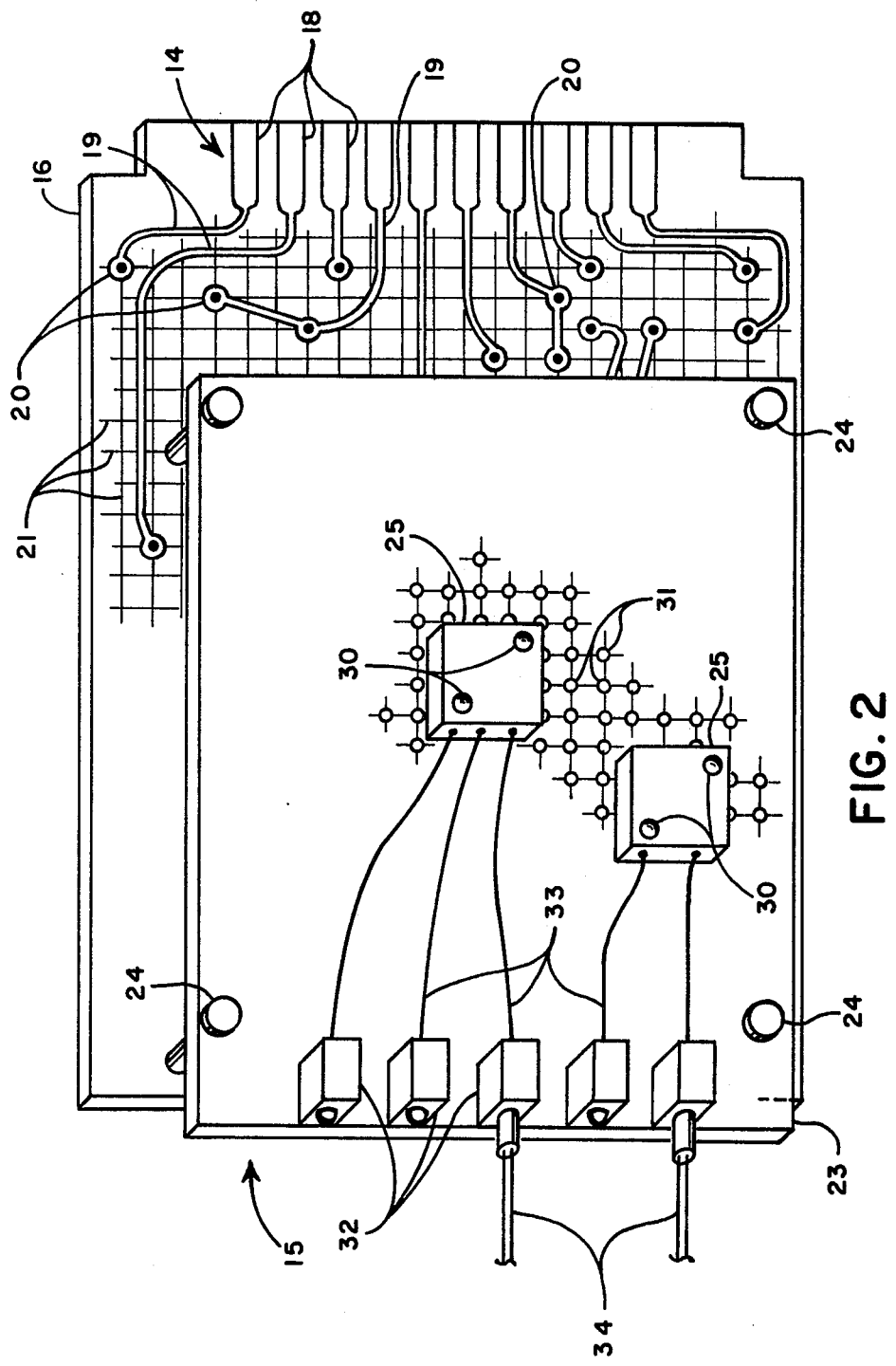
FIG. 2 illustrates a printed circuit board with the applicant's probe apparatus mounted thereon.

In FIG. 1, reference numeral 10 generally identifies an electronics drawer of basically conventional construction which may comprise a portion of a larger electronic system. Drawer 10 comprises a case 11 adapted to receive a plurality of electrical circuit cards 12 which are removably mounted side by side in parallel planes in case 11 through guideways 13. Cards 12 are retained in the case by conventional means (not shown). Electrical interconnections between circuit boards and other portions of the system are made through edge connectors, of which an example of the portion on a board is shown in FIG. 2 where it is identified by reference numeral 14. The stationary mating portion of the connector is mounted at the rear of case 11. For purposes of the present invention, the principal requirement imposed on drawer 10 is that there be sufficient clearance between boards to accommodate probe apparatus identified by reference numeral 15.

Probe apparatus 15 is shown in place as would be required to permit operational analysis of a circuit board under test identified by reference numeral 16. Probe apparatus 15 is detachably mounted on board 16 as will hereinafter be described in greater detail. For mounting purposes, each circuit board is provided with registration holes 17. As is apparent from FIG. 1, probe apparatus 15 is adapted to permit in situ testing of circuit boards mounted in an electronics drawer.

FIG. 2 illustrates circuit board 16 with probe apparatus 15 mounted thereon withdrawn from case 11. Edge connector portion 14 on circuit board 16 includes a plurality of contact elements 18, each of which is connected through a conductive path such as paths 19 to at least one interconnection node 20. In accordance with conventional circuit board layout, interconnection nodes 20 are located only at intersections of a regular grid pattern as illustrated by grid lines 21. Interconnection nodes 20 provide for interconnecting electrical components mounted on the opposite side of board 16, such as component 22 illustrated in FIG. 3. Registration holes 17 in the circuit boards are located in a known positional relationship with grid lines 21 so as to provide for accurate positioning of probe apparatus 15 on the circuit board under test.

Probe apparatus 15 comprises a support member or card 23 which may be formed of sheet stock similar to the stock from which the circuit boards are fabricated. Member 23 is sized to cover at least a number of the grid line intersections comprising permissible node locations. Member 23 is shown mounted on circuit board 16 by means of a plurality of studs 24 which mate with registration holes 17. Studs 24 will hereinafter be described in greater detail in the discussion of FIG. 3.

One or more probe modules 25 are mounted on card 16, each in close proximity to a node of interest for testing purposes. Probe modules 25 are shown mounted on member 23 by means of fasteners 30 which cooperate with holes 31 in the member. Holes 31 are shown located in a regular grid pattern corresponding to the grid pattern designated by lines 21. Accordingly, probe modules 25 may be positioned in close proximity to any of a plurality of nodes of interest, thereby permitting the probe apparatus to be adapted to any desired configuration.

Readout means 32, comprising one or more visual indicators and/or electrical signal connectors, is located along one edge of member 23. Readout means 32 is connected to probe modules 25 by means of conductors 33. The readout means produces visual and/or electrical indications of the signals at the predetermined nodes on circuit board 16. The readout signals may be transmitted to remote testing and/or analysis apparatus by means of cables 32. Alternatively, if it is desirable for test purposes, cables 34 may be used to supply test signals to board 16 through probe modules 25.

Figure 3:
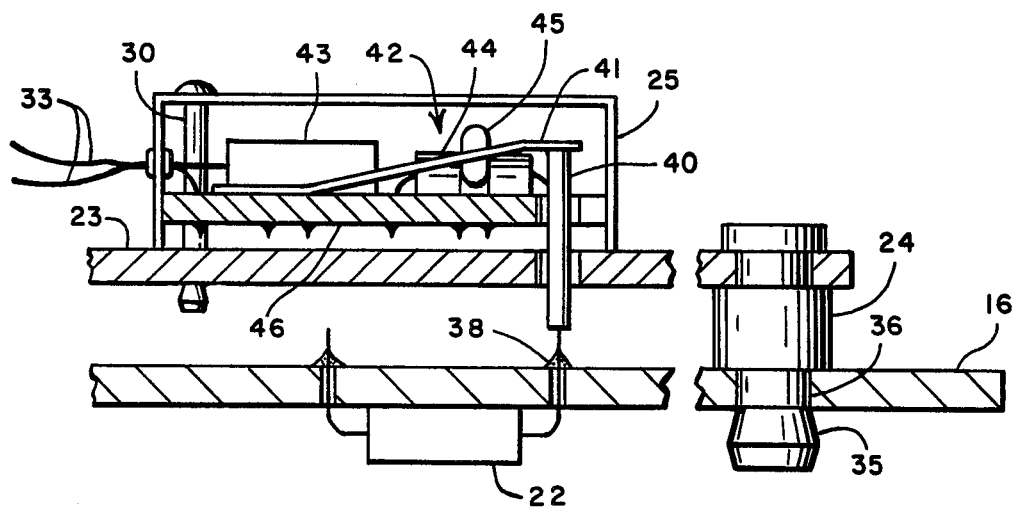
FIG. 3 is an enlarged partial cross-sectional view of the board and probe apparatus of FIG. 2, showing the details of a contact arrangement of a probe module.

As shown in detail in FIG. 3, support member or card 23 is releasably mounted on circuit board 16 by means of studs 24 fixed to the card. Each stud has an enlarged compressible end 35 on the end of a smaller diameter shank 36. The enlarged ends of the studs may be pressed through registration holes 17, whereby the studs grip the circuit board and hold probe apparatus 15 in place. As so mounted, member 23 is positioned closely adjacent board 16, and is juxtaposed with the side of the board from which nodes 20 are accessible. Studs as described for mounting member 23 are commercially available in the form of press-fit teflon bushings marketed by the Sealectro Company.

Probe module 25 includes signal interfacing means comprising at least one pick off element shown as a short contact element 40 which extends through card 23 to make electrical contact with a predetermined interconnection node 38. Contact element 40 is shown spring loaded by means of a leaf spring 41 which also serves to carry signals from the contact to signal conditioning means generally identified by reference numeral 42. It is pointed out that probe module 25 may have more than one signal intefacing means or pick off element. For certain applications, such as differential or relative measurements, two or more pick offs and/or complete signal conditioning channels may be desirable.

It is further pointed out that the signal conditioning function performed by probe module 25 may include any or all of the following, depending on the requirements of the particular application. It may function as a signal processor to modify a sensed signal in amplitude, power, frequency, phase, bandwidth, etc., or convert between analog and digital signal forms. It may function as an optimal signal source to present an output impedance which will accomplish signal transfer to the readout means with minimum interference. Finally, it may function as an ideal electrical input interface or electrical decoupling means.

Decoupling means may comprise any suitable arrangement for providing an interface with the node under investigation, whereby signals at the node are not disturbed either through excessive loading or the introduction of spurious signals. Many such arrangements are well known, and may comprise transformer isolation, any of the various active or passive filter circuits, impedance transformation or optical decoupling, to name but a few examples. As shown for exemplary purposes in FIG. 3, decoupling means 42 includes an operational amplifier 43, a resistor 44 and a capacitor 45 mounted on a small circuit board 46, and interconnected with contact element 40.

As an example of a typical application, the applicant's unique probe apparatus may be used as follows. Decisions are first made as to which nodes on the circuit board under test carry signals which may be useful for analysis, and the most suitable type of signal conditioning for signals at those nodes. Probe modules having appropriate signal conditioning characteristics are then mounted on the support member at locations corresponding to the nodes of interest so that the contact elements of the probe modules are positioned to contact the nodes. The probe apparatus is then mounted in place on the circuit board under test, and the circuit board is inserted in its normal position in the electronics drawer. Electrical performance evaluation of the circuit board can then be conducted with the circuit board in place and subject to its normal environmental conditions. The circuit board is powered by the power supply used during normal operation, and is subject to the same input signal and loading conditions.

If required, the probe apparatus provides electrical decoupling of nodes carrying signals under investigation. Decoupling is achieved in close proximity to the nodes, thus minimizing the length of the signal paths between the nodes and the decoupling means, and minimizing the likelihood of introducing any disturbing signals. Exceptional versatility is provided in that probe modules can be located as desired to investigate signals at any node on the side of the circuit board on which the probe apparatus is mounted. Finally, the probe apparatus is relatively simple and inexpensive.

Although an embodiment of the applicant's unique probe apparatus has been shown and described for illustrative purposes, other embodiments which do not depart from the applicant's contemplation and teaching will be apparent to those skilled in the art. The applicant does not intend that coverage be limited to the disclosed embodiment, but only by the terms of the appended claims.

The embodiments of the invention in which an exclusive property or right is claimed are defined as follows:

1. Probe apparatus for in situ testing of circuit boards of the type which carry electrical components interconnected at nodes accessible from at least one side of the board, said probe apparatus comprising:
    a support member;
    first mounting means for locating said support member closely adjacent a circuit board under test and juxtaposed with a side of the board from which interconnection nodes are accessible;
    a probe module including signal conditioning means and at least one short signal interfacing element for carrying signals between at least one interconnection node and said signal conditioning means;
    second mounting means for mounting said probe module on said support member in close proximity to a predetermined interconnection node so that said signal interfacing element is positioned to interface with at least one predetermined node, whereby the length of the signal path between the node and said signal conditioning means is minimized; and
    readout means connected to said signal conditioning means for producing an indication of signals at said predetermined node.

2. The probe apparatus of claim 1 wherein:
    said signal interfacing element comprises a contact element for making electrical contact with an interconnection node; and said signal conditioning means includes decoupling means capable of receiving electrical signals without significantly disturbing signals at a node contacted by the contact element.

3. The probe apparatus of claim 2 for testing circuit boards on which interconnection nodes are located at grid line intersections, wherein:
    said support member comprises a card sized to cover a plurality of said grid line intersections; and
    said support member and said second mounting means are adapted to permit positioning of said probe module adjacent any one of a plurality of grid line intersections at which nodes may be located.

4. The probe apparatus of claim 3 wherein said readout means produces a visual indication of signals at the predetermined node.

5. The probe apparatus of claim 3 wherein said readout means produces electrical signals indicative of signals at the predetermined node.

6. The probe apparatus of claim 3 wherein said first mounting means comprises a plurality of studs extending from said support member and adapted to grip the circuit board under test through registration holes therein.

7. In testing means for facilitating operational analysis of electronic apparatus including a plurality of circuit boards mounted side by side in parallel planes spaced to accommodate probe apparatus between adjacent circuit boards, each circuit board carrying electrical components interconnected at nodes accessible from at least one side of the board, probe apparatus comprising:
    card means adapted for installation between adjacent circuit boards;
    first mounting means for attaching said card means to a circuit board under test on the side thereof from which interconnection nodes are accessible;
    signal conditioning means;
    second mounting means for attaching said signal conditioning means to said card means at a location in close proximity to at least one node of interest;
    signal interfacing means for carrying signals between said at least one node of interest and said signal conditioning means over a path of minimum length;
    readout means; and
    connecting means for transmitting signals between said signal conditioning means and said readout means.

8. The probe apparatus of claim 7 wherein:

said signal conditioning means includes electrical decoupling means operable to receive electrical signals from said at least one node of interest without significantly disturbing signals thereat;

said signal interfacing means comprises pick off means for sensing signals at said at least one node of interest supplying the sensed signals to said electrical decoupling means over the path of minimum length; and said connecting means transmits signals from said electrical decoupling means to said readout means, whereby said readout means produces an indication of signals at said at least one node of interest.

9. The probe apparatus of claim 8 wherein:

said card means is sized to cover a plurality of permissible node locations; and said card means and said second mounting means are adapted to permit positioning of said electrical decoupling means in close proximity to any of a plurality of permissible node locations.

10. The probe apparatus of claim 8 wherein said readout means comprises visual indicator means.

11. The probe apparatus of claim 8 wherein said readout means comprises means supplying electrical signals indicative of signals at said at least one node of interest.

12. The probe apparatus of claim 8 wherein said first mounting means comprises a plurality of studs extending from said card means and adapted to grip the circuit board under test through registration holes therein.

* * * * *